(12) United States Patent
Landeros et al.

(10) Patent No.: US 10,699,992 B2
(45) Date of Patent: Jun. 30, 2020

(54) REVERSE MOUNTED GULL WING ELECTRONIC PACKAGE

(71) Applicant: Intel Corporation, Santa Clara, CA (US)

(72) Inventors: Juan Landeros, Beaverton, OR (US); Jason M. Seitz, San Francisco, CA (US); Mingjing Huang, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 15/778,393

(22) PCT Filed: Dec. 23, 2015

(86) PCT No.: PCT/US2015/000186
§ 371 (c)(1),
(2) Date: May 23, 2018

(87) PCT Pub. No.: WO2017/111773
PCT Pub. Date: Jun. 29, 2017

(65) Prior Publication Data
US 2018/0337114 A1   Nov. 22, 2018

(51) Int. Cl.
| | |
|---|---|
| H01L 23/12 | (2006.01) |
| H01L 23/495 | (2006.01) |
| H05K 1/18 | (2006.01) |
| H05K 1/11 | (2006.01) |
| H05K 3/00 | (2006.01) |
| H05K 3/34 | (2006.01) |

(52) U.S. Cl.
CPC ........ *H01L 23/49555* (2013.01); *H05K 1/111* (2013.01); *H05K 1/182* (2013.01);
(Continued)

(58) Field of Classification Search
CPC ...... H01L 23/49555; H01L 2924/1203; H05K 1/184; H05K 3/0011; H05K 3/3421;
(Continued)

(56) References Cited

U.S. PATENT DOCUMENTS

| | | | | |
|---|---|---|---|---|
| 5,508,232 A | * | 4/1996 | Ueda | ..... H01L 21/565 29/827 |
| 5,811,879 A | * | 9/1998 | Akram | ..... H01L 25/0655 257/680 |

(Continued)

FOREIGN PATENT DOCUMENTS

| | | |
|---|---|---|
| DE | 112015007224 | 9/2018 |
| KR | 1020150098422 A | 8/2015 |

(Continued)

OTHER PUBLICATIONS

"International Application Serial No. PCT US2015 000186, International Preliminary Report on Patentability dated Jul. 5, 2018", 9 pgs.

(Continued)

*Primary Examiner* — Steven H Loke
*Assistant Examiner* — Samuel Park
(74) *Attorney, Agent, or Firm* — Schwegman Lundberg & Woessner, P.A.

(57) ABSTRACT

An electronic assembly that includes a substrate having an aperture which extends through the substrate. The electronic assembly further includes a gull wing electronic package that includes leads which are solder mounted to the substrate such that the gull wing electronic package is within the aperture in the substrate, wherein the aperture is concentric with an exterior of the gull wing electronic package.

12 Claims, 4 Drawing Sheets

(52) U.S. Cl.
CPC ........... *H05K 1/184* (2013.01); *H05K 3/0011* (2013.01); *H05K 3/3421* (2013.01); *H01L 2924/1203* (2013.01); *H05K 1/117* (2013.01); *H05K 2201/09072* (2013.01); *H05K 2201/09854* (2013.01); *H05K 2201/10174* (2013.01); *H05K 2201/10651* (2013.01); *H05K 2201/10757* (2013.01)

(58) Field of Classification Search
CPC ................... H05K 1/111; H05K 1/182; H05K 2201/10757; H05K 1/117; H05K 2201/10651; H05K 2201/10174; H05K 2201/09854; H05K 2201/09072
See application file for complete search history.

(56) References Cited

U.S. PATENT DOCUMENTS

| | | | | |
|---|---|---|---|---|
| 5,994,648 | A | * | 11/1999 | Glovatsky ............... H05K 1/183 174/254 |
| 2003/0085463 | A1 | * | 5/2003 | Gerber ................... H01L 21/568 257/724 |
| 2009/0243067 | A1 | * | 10/2009 | Camacho ................ H01L 23/13 257/686 |
| 2015/0279758 | A1 | | 10/2015 | Joh |
| 2015/0318239 | A1 | | 11/2015 | Lai et al. |
| 2015/0332995 | A1 | | 11/2015 | Goh et al. |
| 2015/0380384 | A1 | * | 12/2015 | Williams ................. H01L 24/97 438/112 |
| 2016/0294340 | A1 | * | 10/2016 | Goel ....................... H01L 23/66 |

FOREIGN PATENT DOCUMENTS

| | | |
|---|---|---|
| WO | WO-2014064871 A1 | 5/2014 |
| WO | WO-2017111773 A1 | 6/2017 |

OTHER PUBLICATIONS

"International Application Serial No. PCT/US2015/000186, International Search Report dated Sep. 21, 2016", 3 pgs.
"International Application Serial No. PCT/US2015/000186, Written Opinion dated Sep. 21, 2016", 7 pgs.

* cited by examiner

REVERSE MOUNTED GULL WING ELECTRONIC PACKAGE

CROSS-REFERENCE TO RELATED APPLICATION

This application is a U.S. National Stage Filing under 35 U.S.C. 371 from International Application No. PCT/US2015/000186, filed on Dec. 23, 2015, and published as WO 2017/111773, which application is incorporated herein by reference in its entirety.

TECHNICAL FIELD

Embodiments described herein generally relate to electronic assemblies, and more particularly to electronic assemblies that include reverse mounted gull wing electronic packages.

BACKGROUND

Mobile products (e.g., mobile phones, smart phones, tablet computers, wearables, etc.) are typically very restricted in available space because there are often severe limitations for chip and package area and height (among other physical and electrical parameters). Therefore, it is extremely important to reduce the size of electronic components on a substrate.

However, when electronic components/packages are made relatively thin in order to accommodate this need for reduced sized electronic components, there can be difficulties that are associated with fabricating such components. As an example, utilizing standard gull wing electronic packages in electronic components/packages that are required to be relatively thin has historically been a huge challenge for the semiconductor industry.

FIG. 1 shows a conventional gull wing electronic package 10. The gull wing electronic package 10 includes an electronic component 11 and leads 12 extending from the electronic component 11. As examples, the electronic component 11 may be a diode, passive components and/or active components (among other types of electronic components).

FIG. 2 shows the gull wing electronic package 10 of FIG. 1 mounted to a substrate 13 to form a conventional electronic assembly 14. The gull wing electronic package 10 is typically surface mounted to the substrate 13.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic assemblies and methods described herein may address concerns that are usually associated with mechanical fit interference in small electronic devices (e.g., wearable devices). The electronic assemblies and methods described herein may address mechanical fit interference issues while utilizing standard electronic package configurations.

Figure 1:
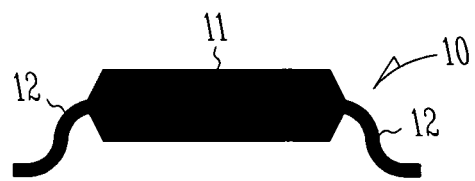
FIG. 1 shows a conventional gull wing electronic package.
Figure 2:
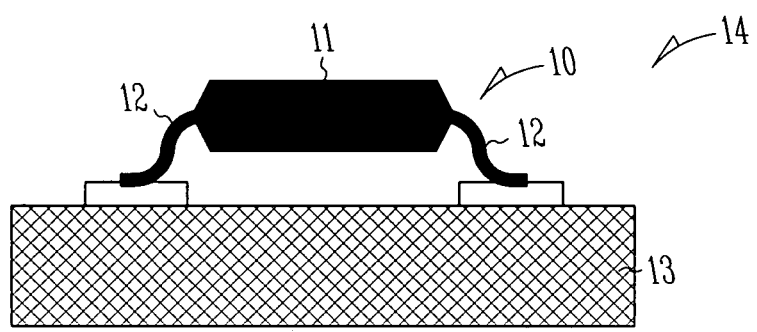
FIG. 2 shows the gull wing electronic package of FIG. 1 mounted to a substrate to form a conventional electronic assembly.
Figure 3:
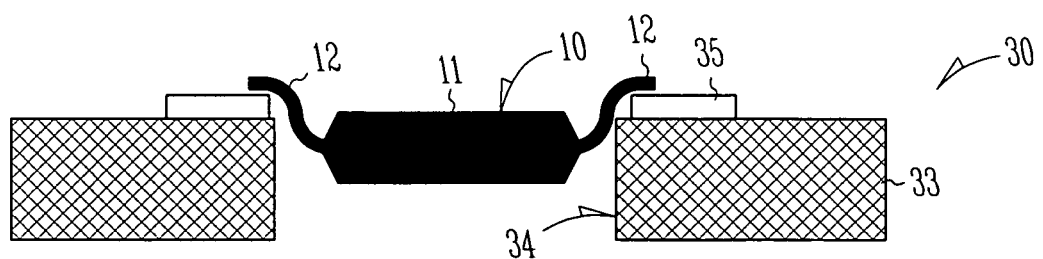
FIG. 3 is a schematic side view illustrating an example electronic assembly that includes a gull wing electronic package.
Figure 4:
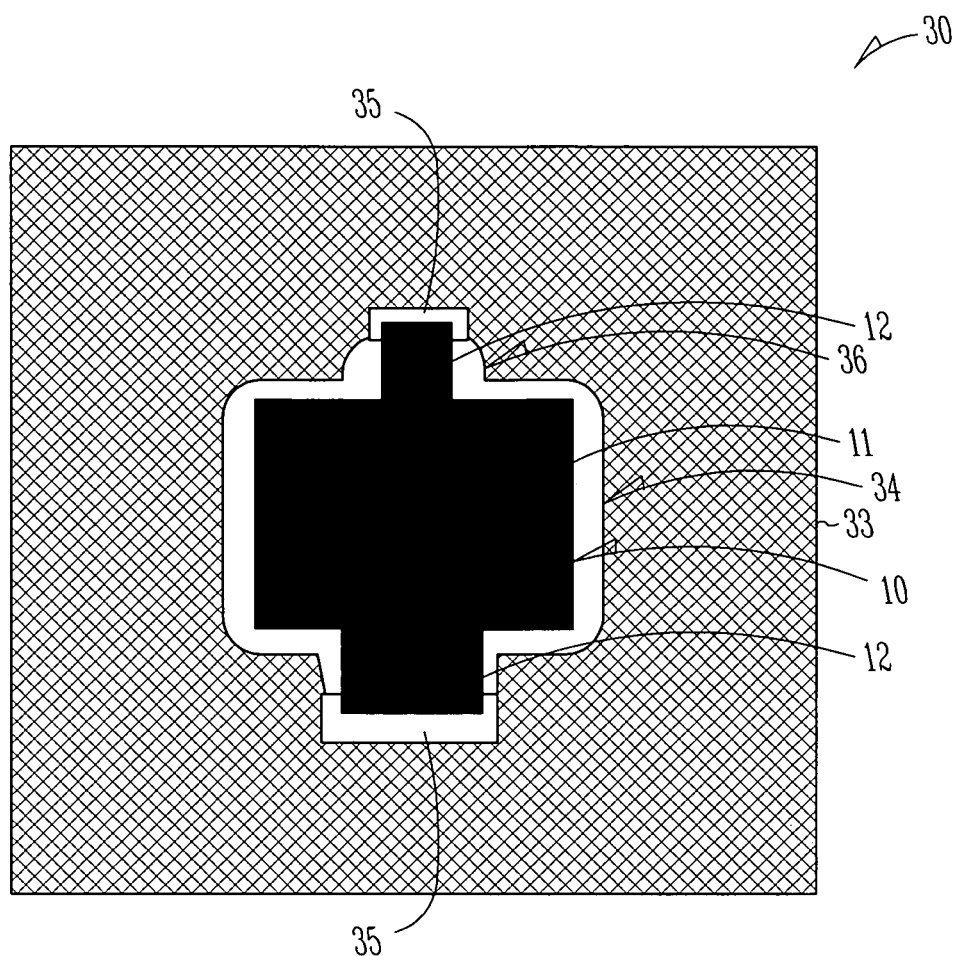
FIG. 4 is a schematic top view illustrating the example electronic assembly shown in FIG. 3.

FIG. 3 is a schematic side view illustrating an example electronic assembly 30 that includes a gull wing electronic package 10. FIG. 4 is a schematic top view illustrating the example electronic assembly 30 shown in FIG. 3.

The electronic assembly 30 includes a substrate 33 having an aperture 34. The electronic assembly 30 further includes a gull wing electronic package 10 that is mounted to the substrate 33 such that the gull wing electronic package 10 is within the aperture 34 in the substrate 33.

In some forms, the substrate 33 is a printed circuit board. It should be noted that the substrate 33 may be any type of substrate that is known now, or discovered in the future. The type of substrate 33 that is included in the electronic assembly 30 will depend in part on the application where the electronic assembly 30 is to be used (among other factors).

As shown in FIGS. 3 and 4, the gull wing electronic package 10 may be mounted to pads 35 on the substrate 33. As an example, the gull wing electronic package 10 may be surface mounted to the pads 35 on the substrate 33.

As shown most clearly in FIG. 4, each of the pads 35 may include edges that are substantially aligned with sidewalls of the aperture 34. Aligning the edges of each pad 35 with the sidewalls of the aperture 34 may provide for additional real estate on the surface of the substrate 33.

The gull wing electronic package 10 includes leads 12 that may be soldered to the pads 35 on the substrate 33. As shown most clearly in FIG. 4, the gull wing electronic package 10 may be mounted to the substrate 33 on opposing sides of the aperture 34. It should be noted that the gull wing electronic package 10 may be mounted to the substrate 33 on one, some, or all sides of the aperture 34.

In the example electronic assembly 30 illustrated in FIGS. 3 and 4, the aperture 34 extends through the substrate 33. In other forms, the aperture 34 may extend partially through the substrate 33.

As shown most clearly in FIG. 4, the aperture 34 may be concentric with an exterior of the gull wing electronic package 10. In other example forms, the aperture may include notches 36 such that each notch 36 receives a lead 12 on the gull wing electronic package 10. The gull wing electronic package 10 includes an electronic component 11 as well as the leads 12 which extend from the electronic component 11.

As an example, the electronic component 12 may be a diode, passive component, and/or active component. The type of electronic component 11 that is included in the gull wing electronic package 10 will depend in part on the application where the electronic assembly 30 is to be used (among other factors).

In some example forms, the gull wing electronic package 10 is a surface mount component that has leads (or pins) folded out from a body of an electronic component (e.g. in an L-shape or S-shape). The gull wing electronic package 10 may have any number and size of leads (e.g., a 10-pin and 14-pin gull wing electronic packages are examples). In addition, the body of the electronic component may have any shape (e.g., rectangular or square).

Some example types of gull wing electronic packages include, but are not limited to, Small Out-line ICs (SOIC), Thin Small-Outline Package (TSOP) semiconductors, Thin Quad Flat Packages (TQFPs). The size of the gull wing electronic packages will depend on the application where the electronic assemblies are to be used (among other factors). As an example, the size of the body (length, width and/or z-height) in the gull wing electronic packages may increase as the number of leads on the gull wing electronic package increases.

The electronic components that are in the body of the gull wing electronic packages are usually standard electronic components may be any type of electronic component that is known now, or discovered in the future. As examples, the electronic components may include resistors, capacitors, inductors and/or various types of integrated circuits.

Figure 5:
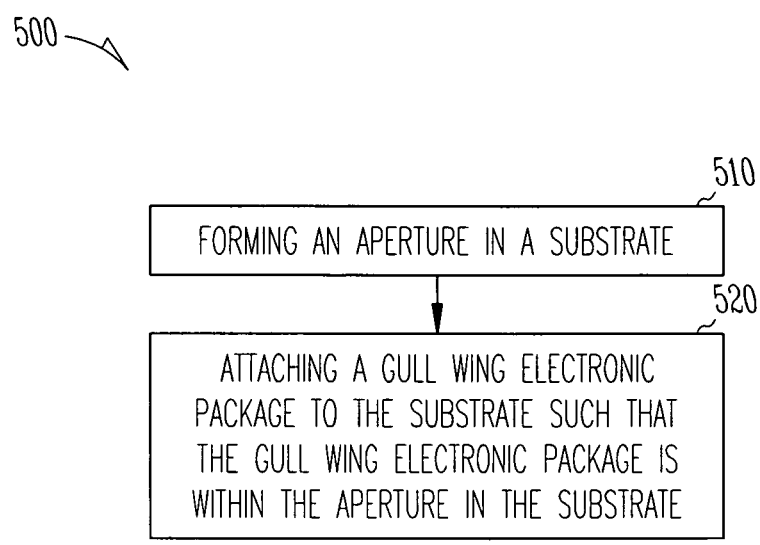
FIG. 5 is a flow diagram of an example method of fabricating an electronic package.

FIG. 5 is a flow diagram illustrating an example method [500] of fabricating an electronic assembly 30. Referring now also to FIGS. 3 and 4, the method [500] includes [510] forming an aperture 34 in a substrate 33. The method further includes [520] attaching a gull wing electronic package 10 to the substrate 33 such that the gull wing electronic package is within the aperture 34.

In some forms, [510] forming an aperture 34 in the substrate 33 may include forming an aperture 34 that extends through the substrate 33. It should be noted that other forms are contemplated where the aperture 34 extends partially through the substrate 33.

In addition, [510] forming an aperture 34 in the substrate 33 may include forming an aperture 34 that is concentric with an exterior of the gull wing electronic package 10 when the gull wing electronic package 10 is mounted to the substrate 33 (see FIG. 4). It should be noted that other types of apertures 34 may be formed in the method [500]. As an example, the aperture 34 may be formed with notches 36 that are adapted to receive leads 12 on the gull wing electronic package 10.

In some forms, [520] attaching a gull wing electronic package 10 to the substrate 33 such that the gull wing electronic package 10 is within the aperture 34 may include solder mounting leads 12 on the gull wing electronic package 10 to the substrate 33 on opposing sides of the aperture 34. It should be noted that the leads 12 on the gull wing electronic package 10 may be mounted to the substrate 33 on one, some or all sides of the aperture 34.

The aperture 34 described herein relative to the electronic assemblies 30 and methods [500] may be configured to ensure proper contact with the pads 35 on the substrate 33 (especially during pick and place manufacturing operations). The pads 35 are located and sized to ensure a sufficient electrical connection (e.g., a solder connection) between the gull wing electronic package 10 and the substrate 33.

The electronic assemblies 30 and methods [500] described herein may provide for lower cost fabrication solutions when using standard electronic components. In addition, the electronic assemblies 30 and methods [500] described herein may facilitate minimizing the Z height of electronic assemblies that include gull wing electronic packages.

Figure 6:
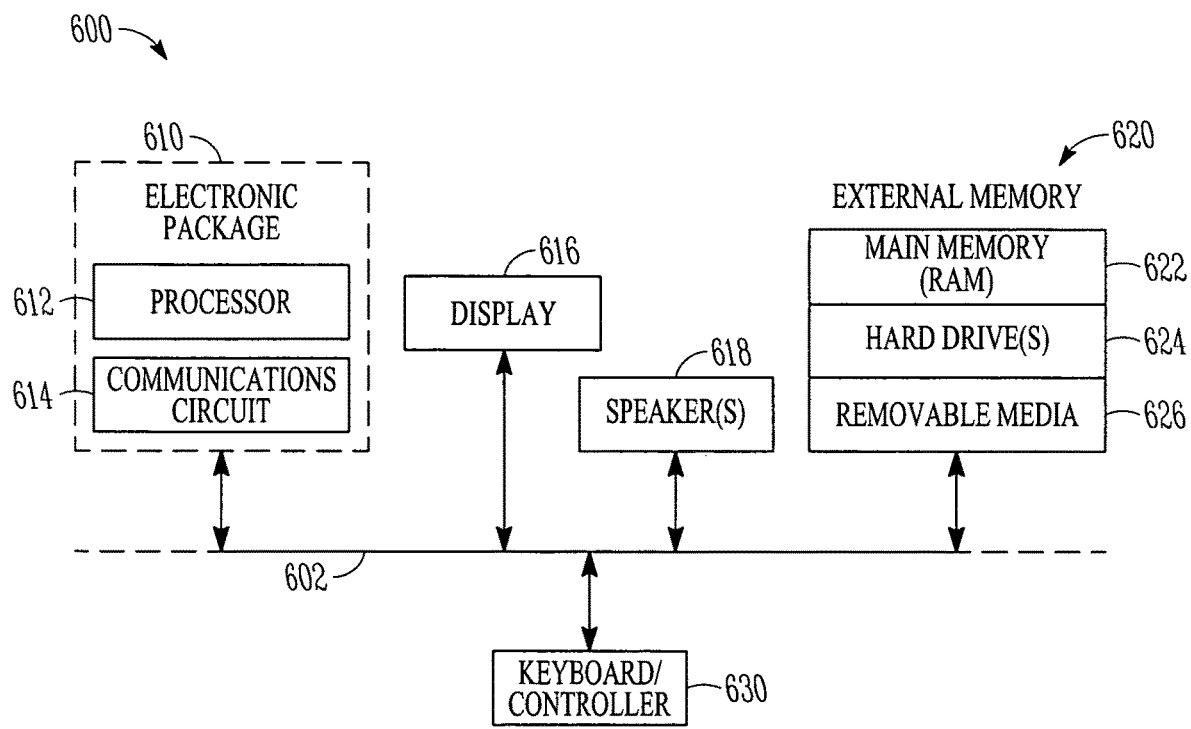
FIG. 6 is block diagram of an electronic apparatus that includes the electronic assemblies described herein.

FIG. 6 is a block diagram of an electronic apparatus 600 incorporating at least one electronic assembly 30 and/or method [500] described herein. Electronic apparatus 600 is merely one example of an electronic apparatus in which forms of the electronic assemblies 30 and/or methods [500] described herein may be used. Examples of an electronic apparatus 600 include, but are not limited to, personal computers, tablet computers, mobile telephones, game devices, MP3 or other digital music players, etc. In this example, electronic apparatus 600 comprises a data processing system that includes a system bus 602 to couple the various components of the electronic apparatus 600. System bus 602 provides communications links among the various components of the electronic apparatus 600 and may be implemented as a single bus, as a combination of busses, or in any other suitable manner.

An electronic assembly 610 as describe herein may be coupled to system bus 602. The electronic assembly 610 may include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 610 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic apparatus 600 may also include an external memory 620, which in turn may include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic apparatus 600 may also include a display device 616, one or more speakers 618, and a keyboard and/or controller 630, which can include a mouse, trackball, touch screen, voice-recognition device, or any other device that permits a system user to input information into and receive information from the electronic apparatus 600.

To better illustrate the electronic assemblies and methods disclosed herein, a non-limiting list of embodiments is provided here:

Example 1 includes an electronic assembly that includes a substrate having an aperture, and a gull wing electronic package mounted to the substrate such that the gull wing electronic package is within the aperture in the substrate.

Example 2 includes the electronic assembly of example 1, wherein the substrate is a printed circuit board.

Example 3 includes the electronic assembly of any one of examples 1-2, wherein the gull wing electronic package is mounted to the pads on the substrate.

Example 4 includes the electronic assembly of any one of examples 1-3, wherein the gull wing electronic package is surface mounted to pads on the substrate.

Example 5 includes the electronic assembly of any one of examples 1-4, wherein each of the pads includes edges that are substantially aligned with side walls of the aperture.

Example 6 includes the electronic assembly of example 5, wherein the gull wing electronic package includes leads that are soldered to the pads on the substrate.

Example 7 includes the electronic assembly of any one of examples 1-6, wherein the gull wing electronic package is mounted to the substrate on opposing sides of the aperture in the substrate.

Example 8 includes the electronic assembly of any one of examples 1-7, wherein the aperture extends through the substrate Example 9 includes the electronic assembly of any one of examples 1-8, wherein the aperture extends partially extends through the substrate.

Example 10 includes the electronic assembly of any one of examples 1-9, wherein the aperture is concentric with an exterior of the gull wing electronic package.

Example 11 includes the electronic assembly of any one of examples 1-10, wherein the aperture includes notches such that each notch receives a lead on the gull wing electronic package.

Example 12 includes the electronic assembly of any one of examples 1-11, wherein the gull wing electronic package includes an electronic component and leads extending from the electronic component.

Example 13 includes the electronic assembly of example 12, wherein the electronic component is a diode.

Example 14 includes a method of fabricating an electronic assembly. The method includes forming an aperture in a substrate; and attaching a gull wing electronic package to the substrate such that the gull wing electronic package is within the aperture in the substrate.

Example 15 includes the method of example 14, wherein forming an aperture in a substrate includes forming an aperture that extends through the substrate.

Example 16 includes the method of any one of examples 14-15, wherein forming an aperture in a substrate includes forming an aperture that is concentric with an exterior of the gull wing electronic package when the gull wing electronic package is mounted to the substrate.

Example 17 includes the method of any one of examples 14-16, wherein attaching a gull wing electronic package to the substrate such that the gull wing electronic package is within the aperture in the substrate includes solder mounting leads on the gull wing electronic package to the substrate on opposing sides of the aperture.

Example 18 includes an electronic assembly that includes a substrate having an aperture which extends through the substrate. The electronic assembly further includes a gull wing electronic package that includes leads which are solder mounted to the substrate such that the gull wing electronic package is within the aperture in the substrate, wherein the aperture is concentric with an exterior of the gull wing electronic package.

Example 19 includes the electronic assembly of example 18, wherein the gull wing electronic package is mounted to the substrate on opposing sides of the aperture in the substrate.

Example 20 includes the electronic assembly of examples 18-19, wherein the gull wing electronic package includes an electronic component and leads extending from the electronic component, wherein the electronic component is a diode.

This overview is intended to provide non-limiting examples of the present subject matter. It is not intended to provide an exclusive or exhaustive explanation. The detailed description is included to provide further information about the electronic assemblies 30 and/or methods [500] described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly, comprising:
a substrate that includes an aperture and a plurality of pads; and
a gull wing electronic package mounted to the substrate such that the gull wing electronic package is within the aperture in the substrate, wherein the gull wing electronic package includes an electronic component and a plurality of leads, wherein each of the plurality of leads extends from the electronic component to an upper surface of a respective pad among the plurality of pads on the substrate, wherein the aperture includes notches such that each notch receives a lead on the gull wing electronic package, wherein each of the plurality of leads on the gull wing package includes a portion that is within one of the notches and a separate portion that is outside the respective notch and engages the upper surface of the respective pad on the substrate.

2. The electronic assembly of claim 1, wherein the substrate is a printed circuit board.

3. The electronic assembly of claim 1, wherein the gull wing electronic package is surface mounted to the plurality of pads on the substrate.

4. The electronic assembly of claim 1, wherein each of the plurality of pads includes edges that are substantially aligned with side walls of the aperture.

5. The electronic assembly of claim 1, wherein each of the plurality of leads are soldered to each respective pad among the plurality of pads on the substrate.

6. The electronic assembly of claim 1, wherein the gull wing electronic package is mounted to the substrate on opposing sides of the aperture in the substrate.

7. The electronic assembly of claim 1, wherein the aperture extends through the substrate.

8. The electronic assembly of claim 1, wherein the aperture partially extends through the substrate.

9. The electronic assembly of claim 1, wherein the electronic component is a diode.

10. An electronic assembly, comprising:
a substrate that includes an aperture which extends through the substrate, and a plurality of pads; and
a gull wing electronic package that includes a plurality of leads which are solder mounted to the substrate such that the gull wing electronic package is within the aperture in the substrate, wherein the gull wing electronic package includes an electronic component with each of the plurality of leads extending from the electronic component to an upper surface of a respective pad among the plurality of pads on the substrate, wherein the aperture includes notches such that each notch receives one of the plurality of leads on the gull wing electronic package, wherein each of the plurality of leads on the gull wing package includes a portion that is within one of the notches and a separate portion that is outside the respective notch and engages the upper surface of the respective pad on the substrate.

11. The electronic assembly of claim 10, wherein the gull wing electronic package is mounted to the substrate on opposing sides of the aperture in the substrate.

12. The electronic assembly of claim 10, wherein the electronic component is a diode.

* * * * *